(12) United States Patent
Gretz

(10) Patent No.: US 8,967,575 B1
(45) Date of Patent: Mar. 3, 2015

(54) ADJUSTABLE BAR HANGER AND ELECTRICAL BOX

(71) Applicant: Thomas J. Gretz, Port St. Lucie, FL (US)

(72) Inventor: Thomas J. Gretz, Port St. Lucie, FL (US)

(73) Assignee: Arlington Industries, Inc., Scranton, PA (US)

( * ) Notice: Subject to any disclaimer, the term of this patent is extended or adjusted under 35 U.S.C. 154(b) by 93 days.

(21) Appl. No.: 13/944,654

(22) Filed: Jul. 17, 2013

(51) Int. Cl.
*H02G 3/12* (2006.01)
*H05K 5/02* (2006.01)

(52) U.S. Cl.
CPC .............. *H05K 5/0204* (2013.01); *H02G 3/125* (2013.01)
USPC ......................................................... 248/343

(58) Field of Classification Search
CPC ........... B60N 2/073; H02G 3/125; H02G 3/10
USPC ........... 220/3.9, 3.7, 3.3; 248/343, 200.1, 906
See application file for complete search history.

(56) References Cited

U.S. PATENT DOCUMENTS

| 5,619,263 A | 4/1997 | Laughlin et al. | |
| 5,938,157 A * | 8/1999 | Reiker | 248/200.1 |
| 6,761,341 B2 * | 7/2004 | Pfaller | 248/200.1 |
| 6,889,943 B2 * | 5/2005 | Dinh et al. | 248/343 |
| 7,735,794 B1 | 6/2010 | Gretz | |

* cited by examiner

*Primary Examiner* — Steven A. Reynolds
*Assistant Examiner* — King M Chu

(57) ABSTRACT

An adjustable hanger bar assembly including an adjustable hanger bar having tubular inner and outer bar members, an electrical box having a top wall with a deep channel therein, and a mounting plate having one or more tensioner tangs. The inner bar member is adapted to slide within the outer bar member. The adjustable hanger bar assembly includes mounting fasteners and an interior channel in which the mounting plate is assembled. With the electrical box mounted to the hanger bar assembly by the mounting fasteners, the hanger bars are tightly held between the channel walls of the electrical box. The tensioner tangs create tension between the mounting bars, the mounting plate, and the electrical box, thereby forming a secure connection between the components that will withstand vibrational forces and prevent separation of the electrical box from the mounting bars.

16 Claims, 7 Drawing Sheets

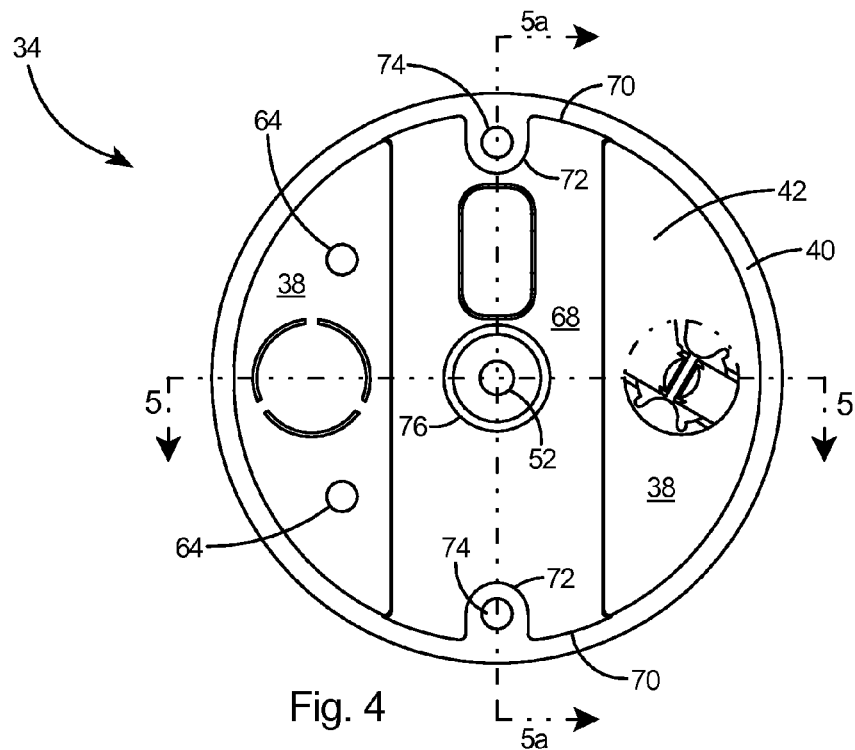
Fig. 4
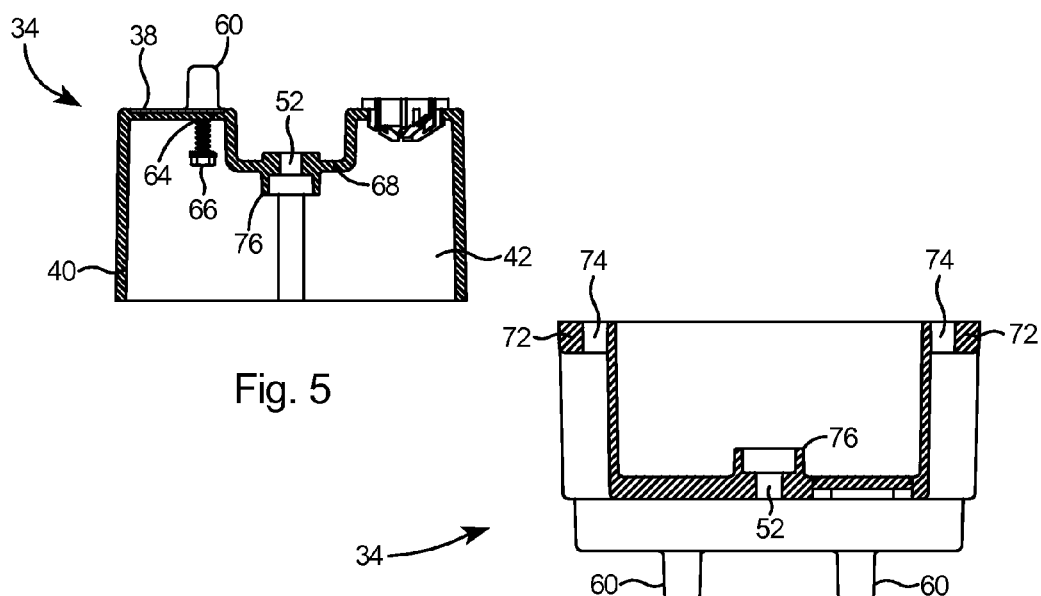
Fig. 5
Fig. 5a

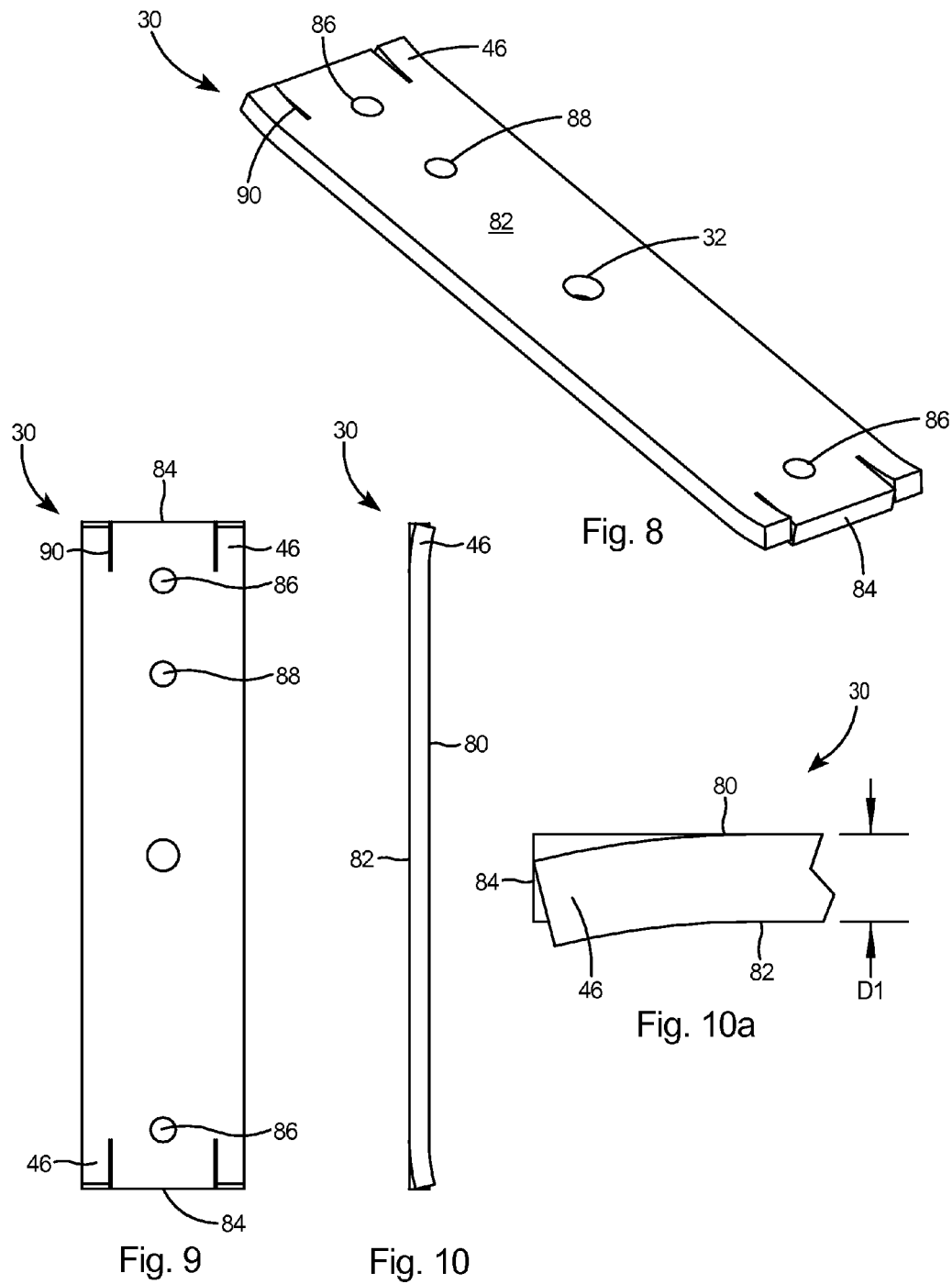

US 8,967,575 B1

ADJUSTABLE BAR HANGER AND ELECTRICAL BOX

FIELD OF THE INVENTION

The present invention generally relates to electrical boxes, and specifically to an adjustable bar hanger and electrical box for mounting an electrical fan or similar device to a ceiling.

BACKGROUND OF THE INVENTION

Although many mounting devices have been proposed for mounting a heavy device such as an electrical fan to a ceiling, most such devices are substantially complex, rendering them expensive to manufacture. Also, such proposed devices, although structurally sound enough to mount a heavy electrical fan, do not adequately protect against the excessive vibrational forces generated by the rotating fan and thus transmitted to the mounting device. Over a period of time, such vibrational forces tend to loosen the connections between the mounting device and the electrical box, thereby creating a dangerous condition in which the fan and fan box are susceptible to falling from the ceiling.

What is needed therefore is an improved mounting device that is substantially simple and inexpensive to produce and that also substantially reduces the possibility of vibrational forces causing the electrical box to become loosened from the mounting device.

BRIEF SUMMARY OF THE INVENTION

The invention is an adjustable hanger bar assembly for mounting an electrical fan or similar device to an overhead structure. The adjustable hanger bar assembly includes an adjustable hanger bar, an electrical box, and a mounting plate. The adjustable hanger bar includes an inner and outer bar member, with the inner bar member adapted to slide within the outer bar member to create an adjustable hanger bar assembly. Each of the mounting bars includes a substantially tubular elongated bar portion and an end plate. The adjustable hanger bar assembly includes an interior channel in which the mounting plate is assembled. The electrical box includes mounting holes therein. The adjustable hanger bar assembly may be adapted to fit between two rafters or similar supports and anchored to the supports by driving fasteners through the end plates of the mounting bars. The electrical box may be loosely assembled to the mounting plate by driving mounting fasteners between the electrical box and the mounting plate. The electrical box can then be slid to any desired position along the adjustable hanger bar assembly after which the mounting fasteners are tightened thereby securing the electrical box to the adjustable hanger bar assembly. The electrical box includes a top wall with a substantially deep channel and channel walls formed therein. With the electrical box mounted to the adjustable hanger bar assembly, the hanger bars are held substantially tightly between the channel walls. The mounting plate is substantially planar and formed of substantially thick metal and includes a plurality of tensioner tangs that are bent out of the plane of the mounting plate at its outer corners. When the mounting fasteners are tightened, the tensioner tangs act to create tension between the mounting bars, the mounting plate, and the electrical box, thereby creating a substantially tight connection between the components that will withstand vibrational forces and prevent separation of the electrical box from the mounting bars.

BRIEF DESCRIPTION OF THE SEVERAL VIEWS OF THE DRAWING(S)

Reference is made herein to the accompanying drawings, which are not necessarily drawn to scale, and wherein:

FIG. 4 is a bottom view of the electrical box.

FIG. 5 is a sectional view of the electrical box taken along line 5-5 of FIG. 4.

FIG. 5a is a sectional view of the electrical box taken along line 5a-5a of FIG. 4.

FIG. 8 is an isometric bottom view of the mounting plate portion of the adjustable hanger bar assembly of FIG. 1.

FIG. 9 is a plan view of the mounting plate.

FIG. 10 is a side view of the mounting plate.

FIG. 10a is a detail view of the mounting plate showing the tensioner tang.

DETAILED DESCRIPTION

Figure 1:
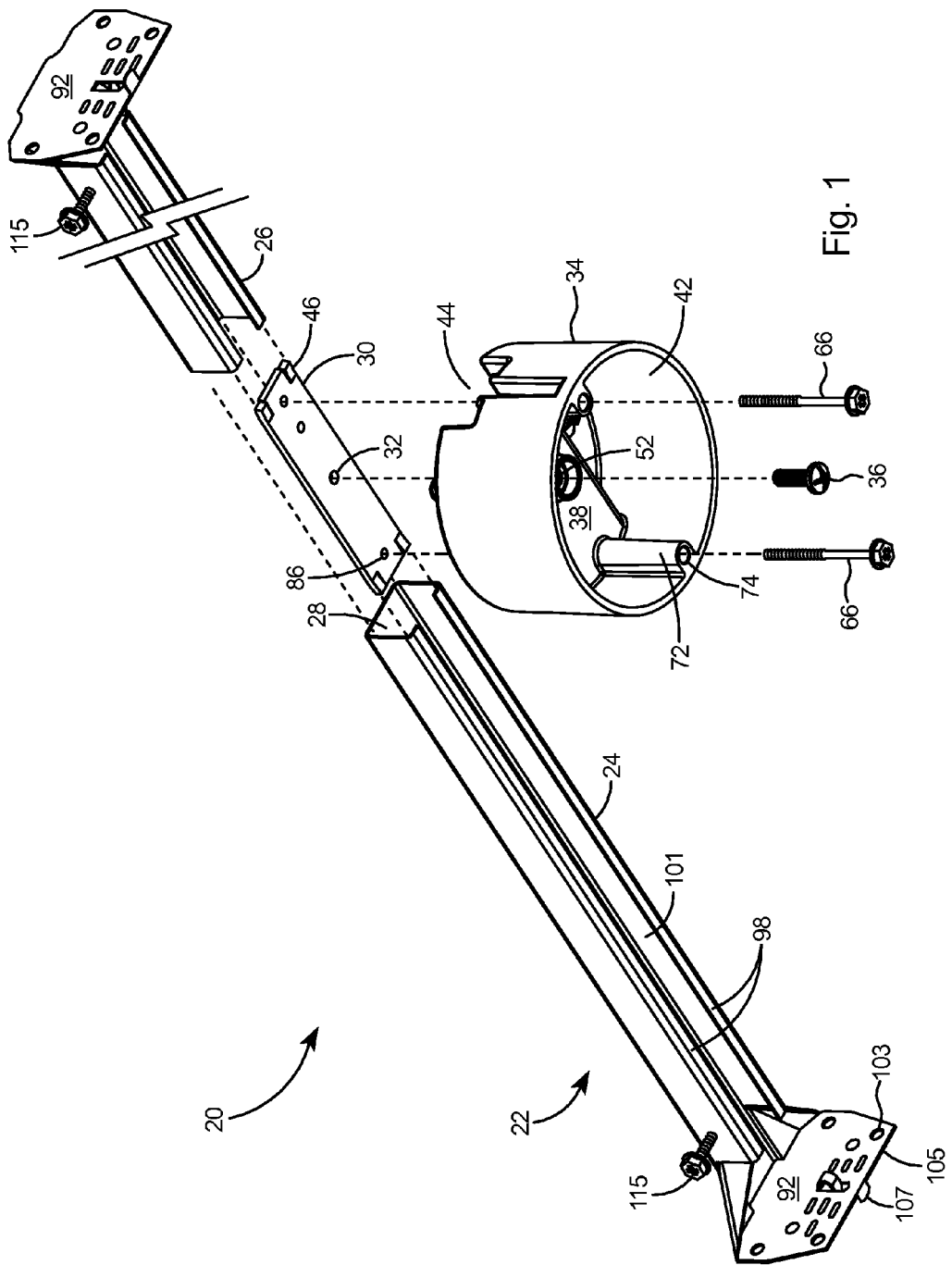
FIG. 1 is an exploded isometric view of an adjustable hanger bar assembly, in accordance with embodiments of the invention.

With reference to FIG. 1, there is shown a preferred embodiment of an adjustable hanger bar assembly 20 according to the present invention. The adjustable hanger bar assembly 20 includes an adjustable hanger bar 22 that includes an inner bar member 24 and an outer bar member 26. The inner bar member 24 is slideable within the outer bar member 26 of the adjustable hanger bar 22, thereby creating an interior channel 28 within the adjustable hanger bar 22.

The adjustable hanger bar assembly 20 includes a substantially planar mounting plate 30 including a bore 32 therein, the mounting plate 30 being slideable within the interior channel 28. The adjustable hanger bar assembly 20 further includes an electrical box 34 that may be mounted to the adjustable hanger bar 22 with a single mounting screw 36 that is driven into mounting bore 32 of mounting plate 30 as shown in FIG. 1 to secure the electrical box 34 to the mounting plate 30 and the adjustable hanger bar 22. The electrical box 34 includes a top wall 38 and sidewall 40 that define an electrical box enclosure 42 therein. A channel 44 extends across the top wall 38 of the electrical box 34. The mounting plate 30 includes one or more tensioner tangs 46 thereon.

With reference to FIGS. 2-5, the channel 44 of the electrical box 34, which extends completely across the entire length of the top wall 38, includes a channel bottom 48 and channel walls 50. The top wall 38 of the electrical box 34 includes a through-hole 52 therein for enabling passage of a fastener for securing the electrical box 34 to the adjustable hanger bar assembly 20.

Figure 2:
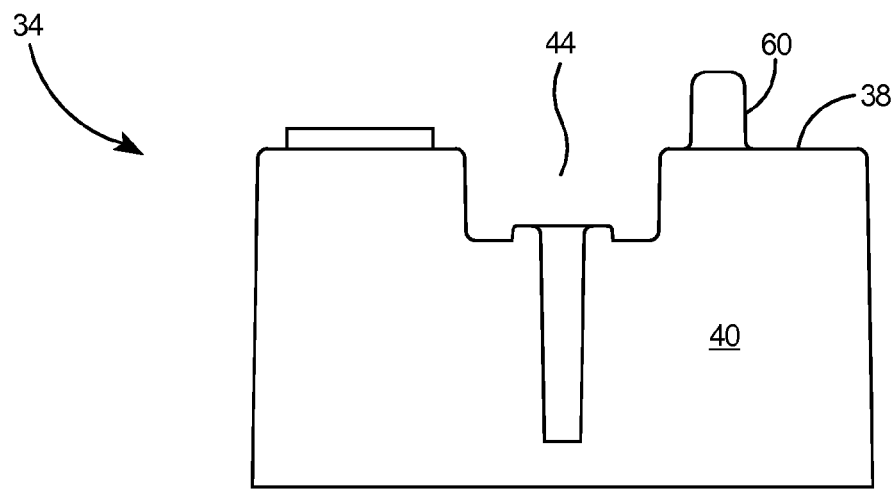
FIG. 2 is a side view of the electrical box portion of the adjustable hanger bar assembly of FIG. 1.
Figure 3:
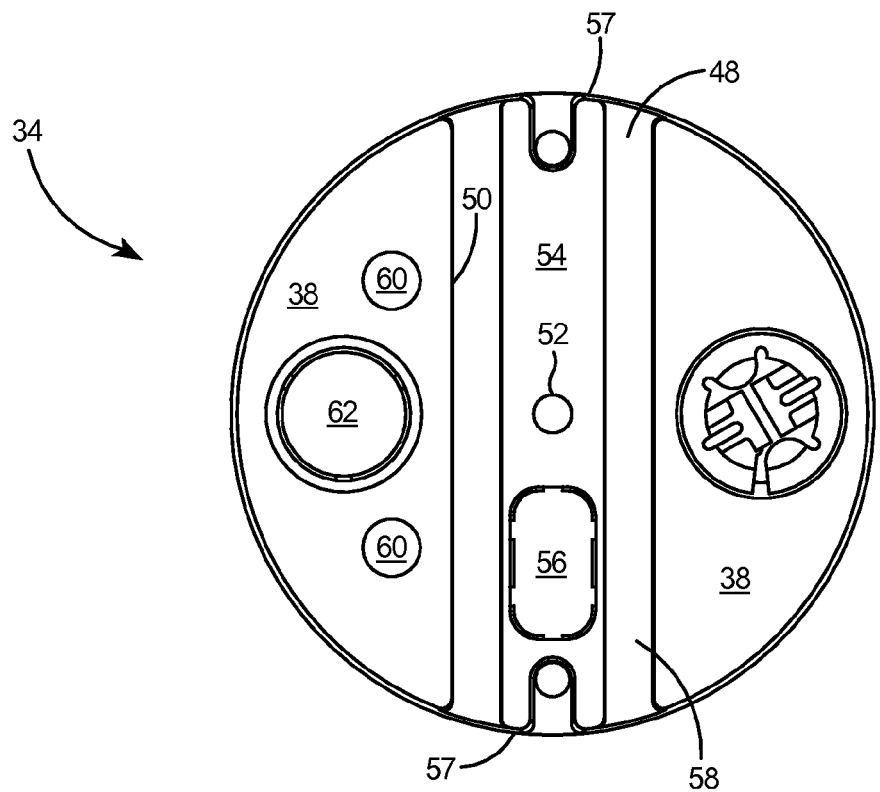
FIG. 3 is a top view of the electrical box.

As shown in FIGS. 2 and 3, the channel bottom 48 includes a bench 54 extending longitudinally along the channel bottom and a knock out wall portion 56 in the bench. The bench 54 includes two ends 57 and provides a resting surface for the mounting plate 30 when the electrical box 34 is assembled directly to the mounting plate 30, such as for packaging of the adjustable hanger bar assembly. With the electrical box 34 and mounting plate 30 assembled together, the bench 54 enables the planar portion of the mounting plate to rest thereon on the bench 54, and tensioner tangs 46 to extend free of the bench 54 and into the channel portions 58 between the bench and the channel walls 50. Electrical box 34 further includes two screw receptacles 60 extending from the top wall 38 a knockout wall portion 62 in the top wall 38 between the screw receptacles 60.

With reference to FIGS. 4 and 5, the screw receptacles 60 include bores 64 therein, which bores are in open communication with the electrical box enclosure 42. A captive screw 66 (see FIG. 5) is held therein in each of the bores 64, one of which is visible in FIG. 5. Within the enclosure 42, the electrical box further includes a raised surface 68 extending across the top wall 38. The raised surface 68 includes two ends 70 and a boss 72 extending from each end 70. The bosses 72 are integral with the sidewall 40 of the electrical box and include a through-hole 74 therein. Through-hole 52 extends through the raised surface 68 of the electrical box and a peripheral wall 76 extends from raised surface 68 and surrounds the through-hole 74.

Figure 6:
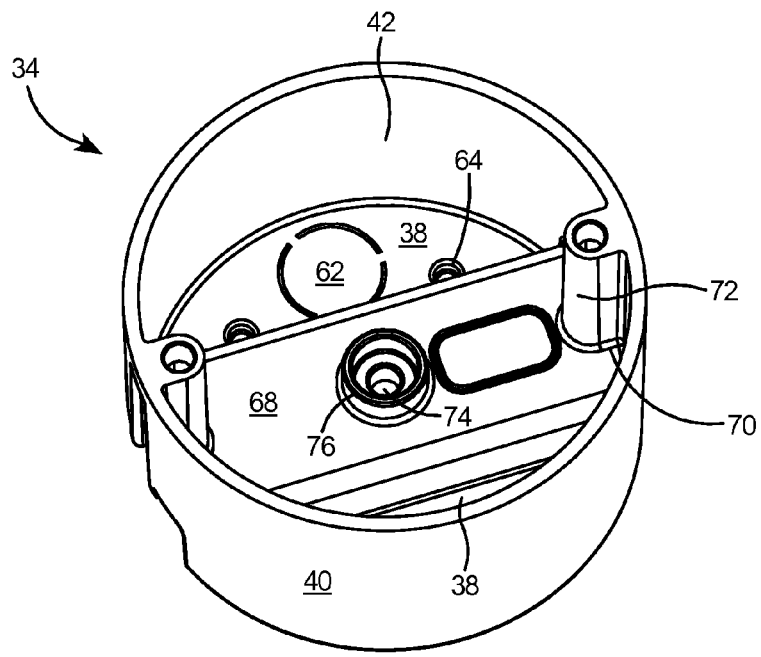
FIG. 6 is a bottom isometric view of the electrical box.
Figure 7:
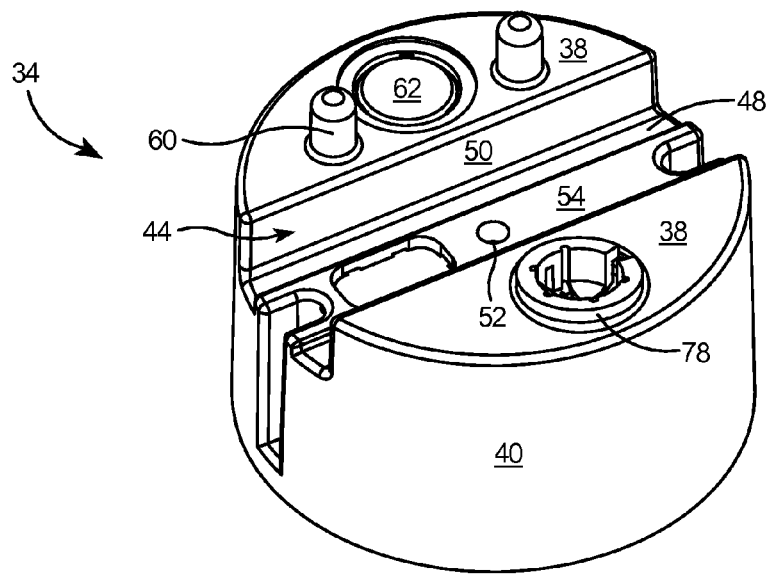
FIG. 7 is a top isometric view of the electrical box.

Referring to the isometric views of the electrical box 34 in FIGS. 6 and 7, the bottom view in FIG. 6 depicts the electrical box enclosure 42, the raised surface 68, and the bosses 72 extending from each end 70 of the raised surface. The peripheral wall 76 surrounds the through-hole 74 that extends through the raised surface 68. The top wall 38, visible on either side of the raised surface 68, includes one or more knockouts 62 therein.

The top view of the electrical box in FIG. 6 depicts the channel 44 extending across the entire length of the top wall 38, including the channel bottom 48 and channel walls 50, the bench 54 with through-hole 52, the screw receptacles 60, and a knockout 62 in the top wall 38. A second knockout has been removed and that side is depicted with an electrical fitting 78 seated in the knockout aperture.

With reference to FIGS. 8-10a, the mounting plate 30 is substantially planar and includes bore 32 substantially centered therein. The mounting plate 30 includes an upper surface 80, a lower surface 82, and two ends 84. End bores 86 and a grounding aperture 88 are also provided in the mounting plate 30, with the grounding aperture 88 adapted to accept a grounding screw (not shown) therein. The mounting plate is further provided with one or more tensioner tangs 46 as shown. The tensioner tangs 46 are each defined by a longitudinal slit 90 in the mounting plate 30 and each tensioner tang 46 is bent toward the lower surface 82 and out of the plane of the mounting plate. Preferably, the mounting plate is constructed of metal and is at least 0.1 inches thick, as denoted by dimension D1 in FIG. 10a.

Figure 11:
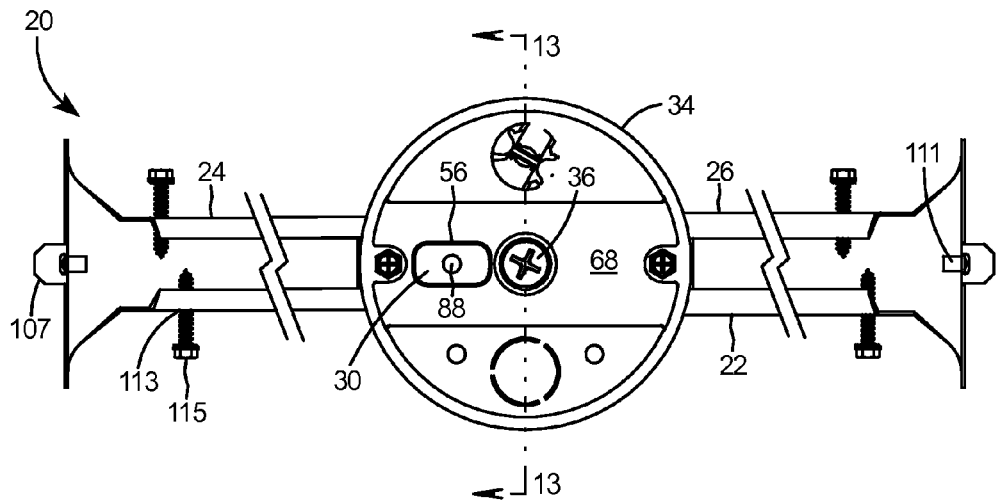
FIG. 11 is a bottom view of the adjustable hanger bar assembly of FIG. 1.

When the electrical box is secured to the adjustable hanger bar as shown in FIG. 11, the grounding aperture 88 of mounting plate 30 is in alignment with the knock out wall portion 56 in the raised surface 68 of the electrical box 34. Thus electrical box 34 may be grounded by affixing a grounding lug from the electrical box 34 to a grounding screw (not shown) that is thence driven into the grounding aperture 88. Electrical box 34 can thus be constructed of metal or plastic as the box will be grounded through the mounting plate 30 and the adjustable hanger bars 22.

Figure 12:
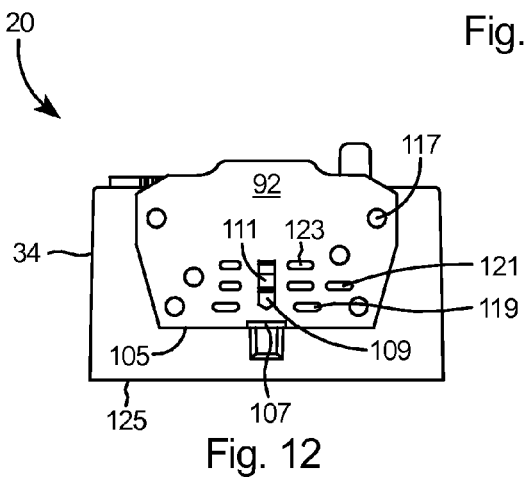
FIG. 12 is an end view of the adjustable hanger bar assembly.

Referring to FIGS. 11-15, each of the bar members 24 and 26 include a tubular bar portion 90 and an end plate 92. The tubular bar portion 90 includes a top wall 94, side walls 96, lips 98 extending inward of the side walls 96, and a slot 101 between the lips 98. The end plates 92 extend from the top wall 94 of the tubular bar portion 90 and include a plurality of nailing apertures 103 therein. As shown in FIG. 12, the end plate 92 includes a bottom edge 105 and a tab 107 extending outward orthogonally from the bottom edge 105. The end plate 92 further includes a slot 109 therein and a nailing flange 111 adjacent the slot. An aperture 113 is provided in one of the side walls 96 of the bar members 24 and 26 and a bar mounting screw 115 is held captive in the aperture 113. The bar mounting screws 115 are threaded into the aperture 113 and are adapted to be removed from the apertures 113 in the side walls 96 and inserted through the end plates 92 for securing the hanger bars 24 and 26 of the adjustable hanger bars 22 to a support structure (not shown).

As further shown in FIG. 12, the end plates 92 include one or more nailing apertures 103 for acceptance of fasteners such as nails or screws for securing the adjustable hanger bars 24 and 26 to a support. End plates 92 further include three rows of slots including a lower row 119, middle row 121, and upper row 123. Each successive row of slots defines a line at which the end plate can be bent along a bend line horizontal to bottom edge 105 in order to increase the distance between the mounted end plate and the bottom edge 125 of the electrical box 34. The bar members 24 and 26 can be mounted with tab 107 flush against the bottom of a support to accommodate ⅝-inch thick wallboard. Alternatively, the end plates 92 can be bent outward at slot rows 119, 121, and 123 to accommodate respectively ¾-inch, 1-inch, and 1¼-inch wallboards.

With reference to FIG. 1, the adjustable hanger bar assembly 20 is used to secure an electrical device, such as a ceiling fan (not shown), to an overhead support. The electrical box 34 is first loosely assembled to the mounting bar 30 with mounting screw 36 to form an electrical box and mounting bar assembly. The mounting bar portion 30 of the electrical box and mounting bar assembly is then slid into interior channel 28 of adjustable hanger bar 22. The end plates 92 can be bent at any of successive rows of slots 119, 121, and 123 to accommodate the appropriate thickness of wallboard. The length of the adjustable hanger bar 22 is then adjusted to the proper length to span between two overhead supports (not shown), such as ceiling rafters. Fasteners (not shown) are then driven through nailing apertures 103 to secure the mounting bars 24 and 26 and the adjustable hanger bar assembly 20 to the overhead support. The electrical box 34 and mounting bar 30 assembly is then slid to the desired location for mounting the ceiling fan or similar electrical device. Mounting screw 36 is then tightened to secure the electrical box 34 and mounting plate 30 to the adjustable hanger bar assembly. An electrical device (not shown) is then secured to the assembly 20 by removing captive screws 66 from the bores 64 in screw receptacles 60 (see FIG. 5) and placing the screws 66 through through-holes 74 xx in electrical box 34 and driving them into end bores 86 of mounting plate 30. After the assembly is tightened, tensioner tangs 46 apply pressure between the mounting plate 30 and hanger bars 24 and 26, thereby keeping the adjustable hanger bar assembly 20 tightly secured together during vibration of the electrical device.

Figure 13:
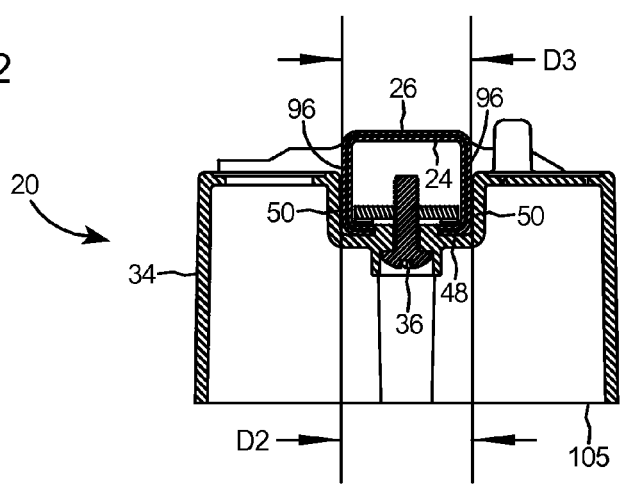
FIG. 13 is a sectional view of the adjustable hanger bar assembly taken along line 13-13 of FIG. 11.
Figure 14:
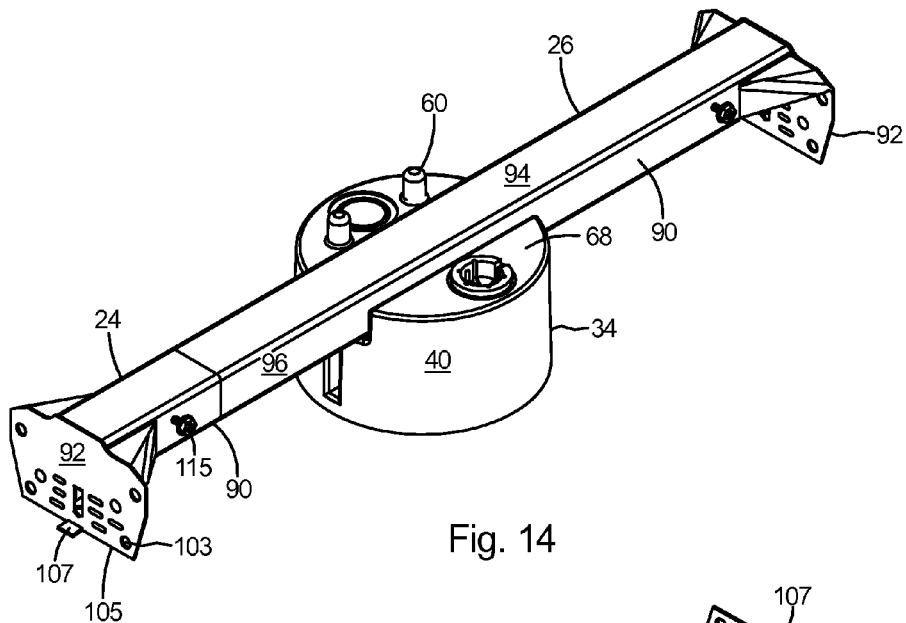
FIG. 14 is a top isometric view of the adjustable hanger bar assembly.
Figure 15:
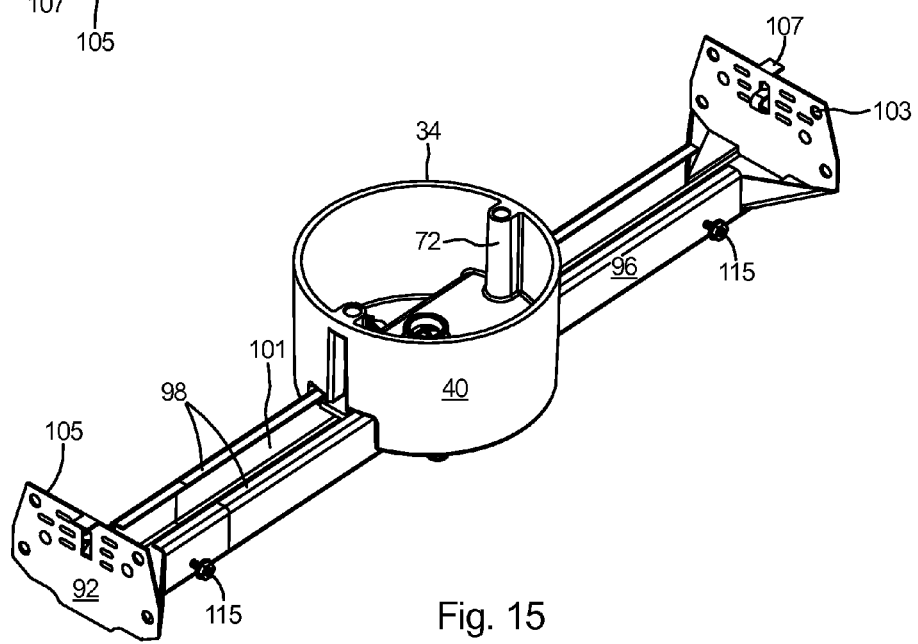
FIG. 15 is a bottom isometric view of the adjustable hanger bar assembly.

As shown in FIG. 13, which depicts the adjustable hanger bar assembly in its fully assembled state, the distance between the channel walls 50, as denoted by dimension D2, is no more than 0.05 inch greater than the dimension across the side walls 96 of the outer member 26, as denoted by dimension D3. Thus the hanger bars 24 and 26 are held in a tight fit between the channel walls 50 in addition to being tightly clamped to the channel bottom 48 by mounting screw 36 and mounting plate 30. This tight fit of the mounting bars within the channel 44 (see FIG. 7) further stabilizes the adjustable hanger bar assembly 20 and prevents loosening of the assembly during vibration of a connected electrical device.

As shown in FIG. 5, the peripheral wall 76 surrounding the through-hole 52 helps prevent accidental grounding through the mounting screw 36 (see FIG. 13) when the electrical box 34 is secured to the adjustable hanger bar 22 to form the adjustable hanger bar assembly 20. The mounting bars 24 and 26 of the present invention are preferably constructed of metal. The electrical box 34 is preferably constructed of metal or plastic.

Having thus described the invention with reference to a preferred embodiment, it is to be understood that the invention is not so limited by the description herein but is defined as follows by the appended claims. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments herein were chosen and described in order to best explain the principles of the invention and the practical application, and to enable others of ordinary skill in the art to understand the invention.

What is claimed is:

1. An adjustable hanger bar assembly for securing an electrical box to an overhead support, said adjustable hanger bar assembly comprising:
    an adjustable hanger bar including an inner bar member slideable within an outer bar member, said adjustable hanger bar including an interior channel;
    a substantially planar mounting plate including a bore therein, said mounting plate slideable within said interior channel;
    an electrical box including a sidewall and a top wall defining an electrical box enclosure, and a channel extending across said top wall;
    a tensioner tang on said mounting plate;
    said channel of said electrical box includes a channel bottom and channel walls;
    a through-hole in said channel bottom of said electrical box;
    a mounting screw for securing said electrical box to said mounting plate and said adjustable hanger bar;
    a bench extending longitudinally along said channel bottom; and
    a knock out wall portion in said bench.

2. The adjustable hanger bar assembly of claim 1, wherein each of said bar members include a tubular bar portion and an end plate.

3. An adjustable hanger bar assembly for securing an electrical box to an overhead support, said adjustable hanger bar assembly comprising:
    an adjustable hanger bar including an inner bar member slideable within an outer bar member, said adjustable hanger bar including an interior channel;
    a substantially planar mounting plate including a bore therein, said mounting plate slideable within said interior channel;
    an electrical box including a sidewall and a top wall defining an electrical box enclosure, and a channel extending across said top wall;
    a tensioner tang on said mounting plate;
    said channel of said electrical box includes a channel bottom and channel walls;
    said enclosure of said electrical box includes a raised surface extending across said top wall, said raised surface including two ends; and
    a boss extending from each end of said raised surface, said bosses integral with said sidewall of said electrical box and including a bore therein.

4. The adjustable hanger bar assembly of claim 2, wherein said tubular bar portion includes a top wall, side walls, lips extending inward of said side walls, and a slot between said lips.

5. The adjustable hanger bar assembly of claim 4, wherein said end plates extend from said top wall of said tubular bar portion; and
    said end plates include a plurality of apertures therein.

6. The adjustable hanger bar assembly of claim 5, wherein said end plate includes a bottom edge and a tab extending outward from said bottom edge.

7. The adjustable hanger bar assembly of claim 5, wherein said end plate includes a slot therein and a nailing flange adjacent said slot.

8. The adjustable hanger bar assembly of claim 1, wherein said mounting plate is substantially planar; and
    said mounting plate includes an upper surface, a lower surface, and two ends.

9. An adjustable hanger bar assembly for securing an electrical box to an overhead support, said adjustable hanger bar assembly comprising:
    an adjustable hanger bar including an inner bar member slideable within an outer bar member, said adjustable hanger bar including an interior channel;
    a substantially planar mounting plate including a bore therein, said mounting plate slideable within said interior channel;
    an electrical box including a sidewall and a top wall defining an electrical box enclosure, and a channel extending across said top wall;
    a tensioner tang on said mounting plate;
    said tensioner tang on said mounting plate is defined by a longitudinal slit in said mounting plate; and
    said tensioner tang is bent toward said lower surface and out of said plane of said mounting plate.

10. The adjustable hanger bar assembly of claim 1, wherein said mounting plate includes a grounding aperture therein, said grounding aperture adapted to accept a grounding screw therein; and
    said grounding aperture is in alignment with said knock out wall portion of said electrical box when said electrical box is secured to said adjustable hanger bar.

11. The adjustable hanger bar assembly of claim 1 wherein said through-hole extends through said raised surface of said electrical box; and
    a peripheral wall extends from raised surface and surrounds said through-hole.

12. The adjustable hanger bar assembly of claim 3, including
    two screw receptacles extending from said top wall of said electrical box;
    bores in said screw receptacles, said bores open to said electrical enclosure;
    a captive screw in each of said bores; and
    end bores in said mounting plate.

13. The adjustable hanger bar assembly of claim 12, wherein an electrical device is secured to said adjustable hanger bar by removing said captive screws from said screw receptacles and driving said captive screws through said bores in said bosses of said electrical box and into said end bores of said mounting plate.

14. The adjustable hanger bar assembly of claim 12, including a knock out wall portion between said screw receptacles in said top wall of said electrical box.

15. The adjustable hanger bar assembly of claim 4, including
- an aperture in one of said side walls of said bar members; and
- a bar mounting screw captive in said aperture, said bar mounting screws adapted to be removed from said apertures in said side walls and inserted through said end plates for securing said hanger bars to a support structure.

16. The adjustable hanger bar assembly of claim 4, wherein the distance between said channel walls is no more than 0.05 inch greater than the dimension across said side walls of said outer member.

* * * * *